United States Patent
Kinoshita et al.

(10) Patent No.: US 6,788,534 B2
(45) Date of Patent: Sep. 7, 2004

(54) INTAKE MODULE HAVING INTEGRATED ECU

(75) Inventors: Kenji Kinoshita, Kariya (JP); Satoru Umemoto, Kariya (JP)

(73) Assignee: Denso Corporation, Kariya (JP)

( * ) Notice: Subject to any disclaimer, the term of this patent is extended or adjusted under 35 U.S.C. 154(b) by 80 days.

(21) Appl. No.: 10/351,314

(22) Filed: Jan. 27, 2003

(65) Prior Publication Data

US 2003/0142481 A1 Jul. 31, 2003

(30) Foreign Application Priority Data

Jan. 31, 2002 (JP) .......................................... 2002-022851

(51) Int. Cl.⁷ ................................................. H05K 7/20

(52) U.S. Cl. ....................... 361/690; 361/688; 361/694; 361/715; 361/719; 361/720; 165/80.3

(58) Field of Search .............................. 165/80.3, 121, 165/122, 185; 361/600, 679, 688–689, 690–695, 728, 730, 752, 753, 719, 720, 715; 454/184

(56) References Cited

U.S. PATENT DOCUMENTS

| | | | | | |
|---|---|---|---|---|---|
| 4,763,224 A | * | 8/1988 | Bentz et al. | ................. | 361/704 |
| 5,461,542 A | * | 10/1995 | Kosak et al. | ................ | 361/710 |
| 6,008,454 A | * | 12/1999 | Kawakita | .................... | 174/52.1 |
| 6,273,181 B1 | * | 8/2001 | Matsui et al. | | |
| 6,341,063 B2 | * | 1/2002 | Kinoshita et al. | ............ | 361/690 |

FOREIGN PATENT DOCUMENTS

JP   U-63-155694   10/1988

\* cited by examiner

*Primary Examiner*—Gregory D. Thompson
(74) *Attorney, Agent, or Firm*—Nixon & Vanderhye P.C.

(57) ABSTRACT

An intake module has an electronic control unit (ECU) housing portion that houses an ECU. The ECU housing portion is provided in a manner that a lateral direction of the ECU housing portion is approximately coincident with a direction of an intake air passage that is located upstream from the ECU housing portion. Intake air is blown to an air blown area that is located on one side of the ECU housing portion. Heat-producing components and low heat-resistant components are mounted in the air blown area and in an area away from the air blown area, respectively. A plurality of heat-radiating fins is arranged in the air blown area along with a stream of the intake air.

11 Claims, 7 Drawing Sheets

INTAKE MODULE HAVING INTEGRATED ECU

CROSS REFERENCE TO RELATED APPLICATION

This application is based on and incorporates herein by reference Japanese Patent Application No. 2002-22851 filed on Jan. 31, 2002.

FIELD OF THE INVENTION

The present invention relates to an intake module having an integrally housed ECU for a vehicle.

BACKGROUND OF THE INVENTION

An intake module having an integrally housed electronic control unit (ECU) for a vehicle has been introduced. A Number of heat radiating fins are arranged around an ECU case as a cooling device. When the air flows through an intake air passage, the heat radiated from the ECU is released via the heat radiating fins. Therefore, the temperature of the ECU is controlled.

However, the heat radiating fins block the airflow in the intake air passage. As a result, a pressure loss is produced and engine performance decreases due to the pressure loss. To solve this problem, the heat radiating fins in the intake air passage need to be removed. However, a heat radiating capability of the ECU decreases if the heat radiating fins are removed from the intake air passage. Therefore, an internal temperature of the ECU increases. This may cause damage to electronic components.

SUMMARY OF THE INVENTION

The present invention therefore has an objective to provide an intake module having an integrally housed ECU and a cooling device for the ECU to reduce heat damage to electronic components. In an intake module of the present invention, intake air is blown to an air blown area of an ECU housing portion. The air blown area is located on one side of the ECU housing portion. Heat-producing components and low heat-resistant components are mounted in the air blown area and away form the air blown area of a circuit board of the ECU, respectively.

With this configuration, the intake air effectively removes heat from the heat-producing components. As a result, a temperature increase in the ECU is controlled and the heat damage to the electronic components is reduced.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENT

Figure 1A:
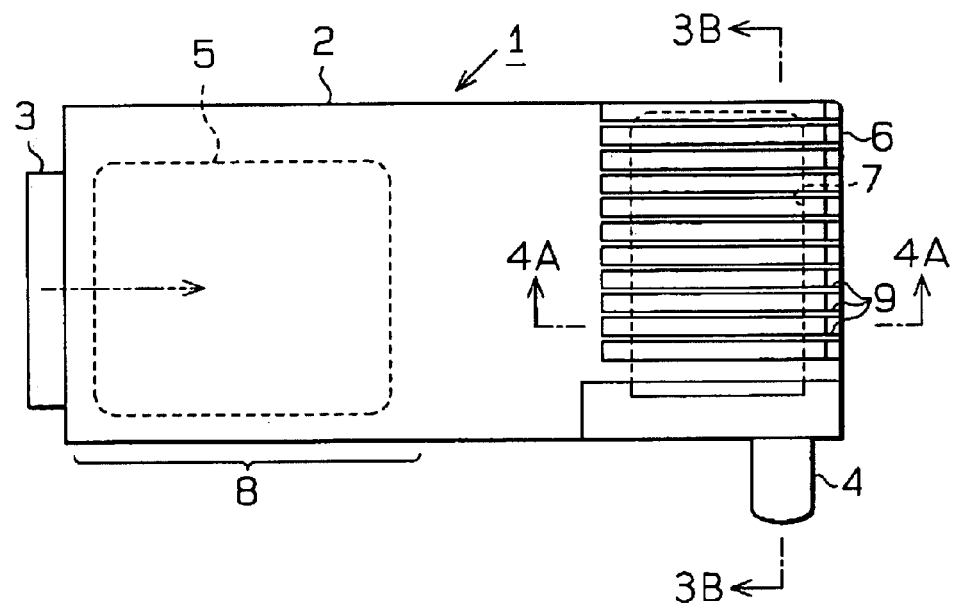
FIG. 1A is a top view of an intake module according to the first embodiment of the present invention.

The preferred embodiments of the present invention will be explained with reference to the accompanying drawings. In the drawings, the same numerals are used for the same components and devices.

First Embodiment

Figure 1B:
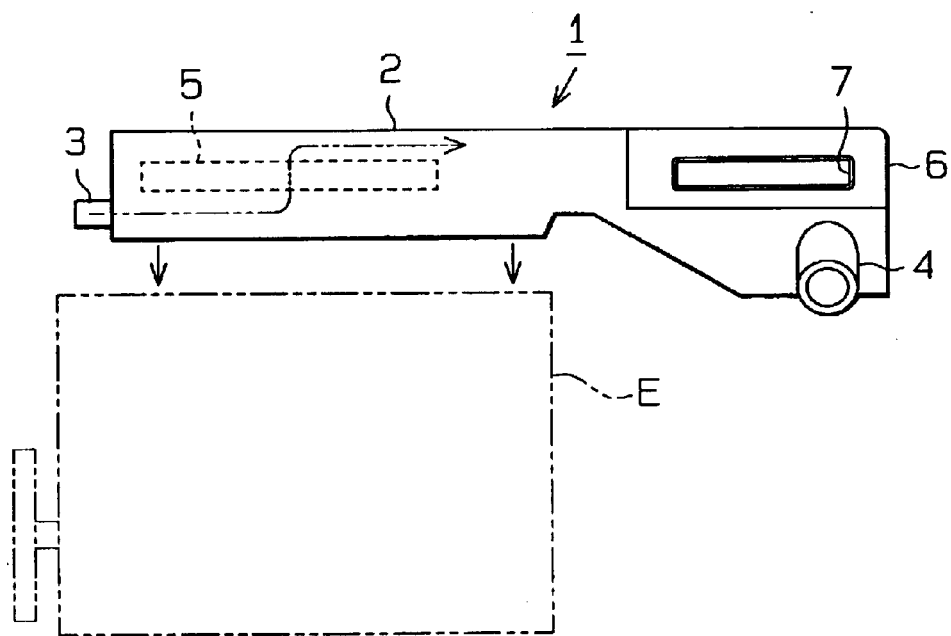
FIG. 1B is a front view of the intake module of FIG. 1A.

Referring to FIGS. 1A and 1B, an intake module 1 includes a casing 2, which is made of resin, such as polypropylene. The casing 2 has an air intake passage in its hollow portion, an air inlet 3, and an air outlet 4. The casing 2 houses an air cleaner 5 near the air inlet 3. Air that is drawn into the intake module via the air inlet 3 passes through the air cleaner 5, and flows out via the air outlet 4. Then, the air flows into an engine E via an air intake hose (not shown).

Figure 2:
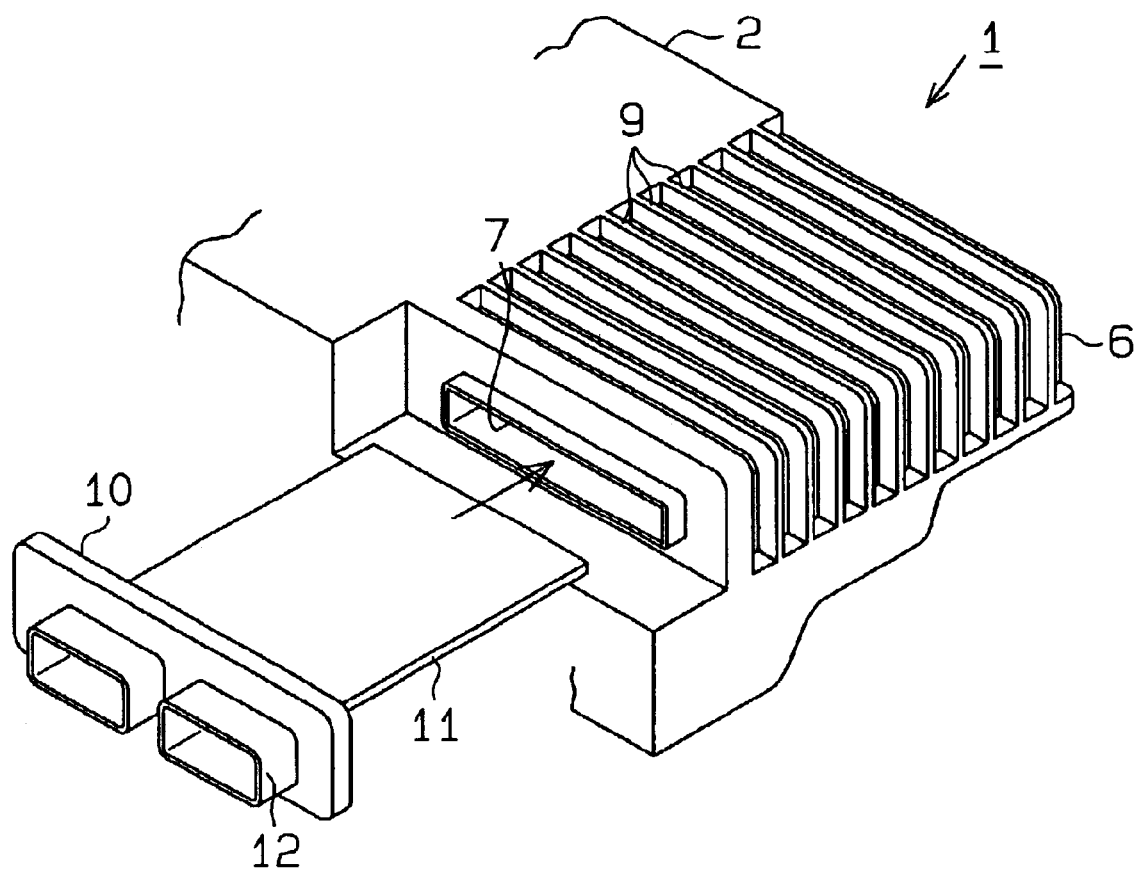
FIG. 2 is a perspective view of an electronic control unit (ECU) housing portion of the intake module.
Figure 3A:
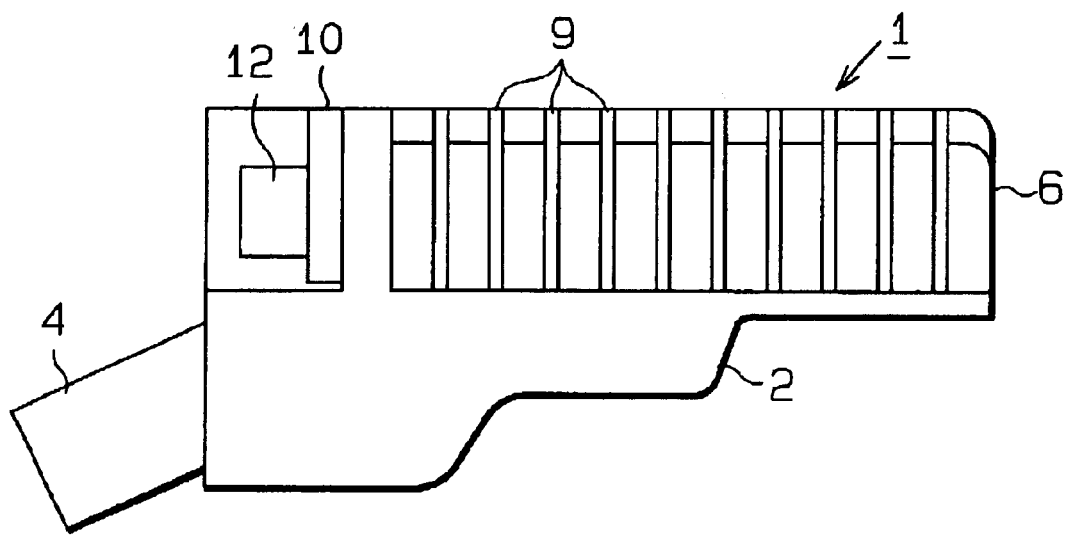
FIG. 3A is a side view of the ECU housing portion of the intake module.
Figure 3B:
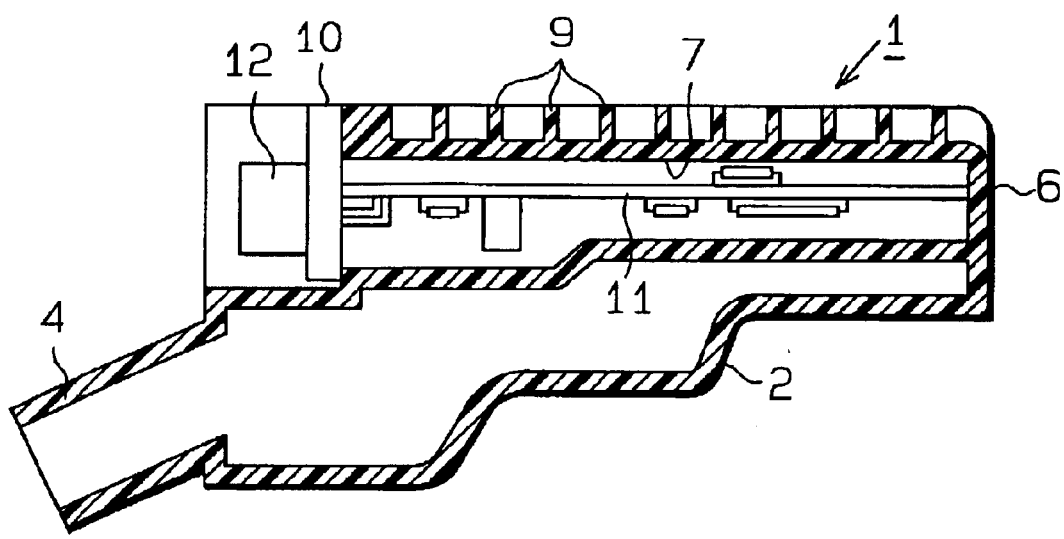
FIG. 3B is a side cross-sectional view of the ECU housing portion of the intake module taken along line 3B—3B of FIG. 1.

The casing 2 has an electronic control unit (ECU) housing portion 6. The ECU housing portion 6 has a slot 7, which has an opening on only one side. A circuit board 11 of an ECU 10 is inserted into the slot through the opening as shown in FIGS. 2, 3A, and 3B. The ECU 10 has connectors 12. The ECU housing portion 6 has a number of reinforcement ribs 9 on its outer periphery. The reinforcement ribs 9 are formed together with the casing 2 when the casing 2 is molded. The reinforcement ribs 9 are arranged at regular intervals in parallel with a longitudinal side of the intake module 1. An air cleaner housing portion 8 is mounted on the engine E with three or four mounting screws.

Figure 4A:
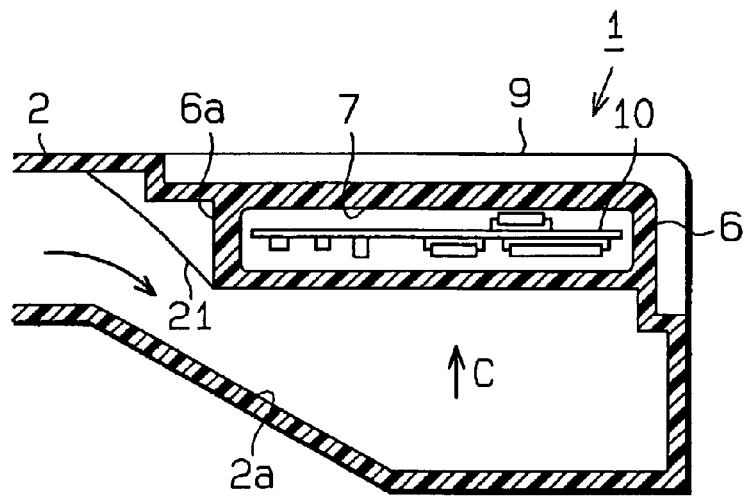
FIG. 4A is a front cross-sectional view of the intake module taken along line 4A—4A of FIG. 1, showing a structure inside a casing.
Figure 4B:
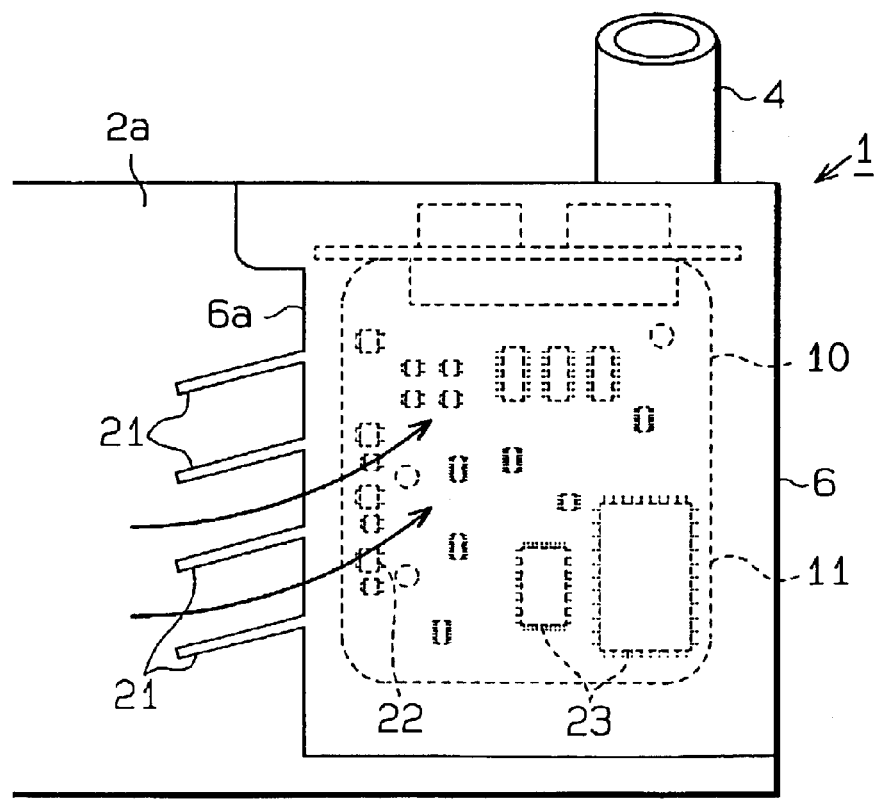
FIG. 4B is a bottom view of inside the ECU housing portion, a view from point C of FIG. 4A.

Referring to FIGS. 4A and 4B, the casing 2 has an intake air passage 2a. The intake air flows down in the intake air passage 2a toward the air outlet 4. The ECU housing portion 6 is provided in a manner that a lateral direction of the ECU housing portion 6 is approximately coincident with a direction of an intake air passage that is located upstream from the ECU housing portion 6. Furthermore, the ECU housing portion 6 extruded to the air passage 2a. Therefore, the intake air is blown to an air blown area 6a, which is located on a side of the ECU housing portion 6. The air blown area 6a has a number of heat-radiating fins 21 at regular intervals along with the intake air stream. The thickness of each fin 21 gradually decreases toward its tip.

Figure 5:
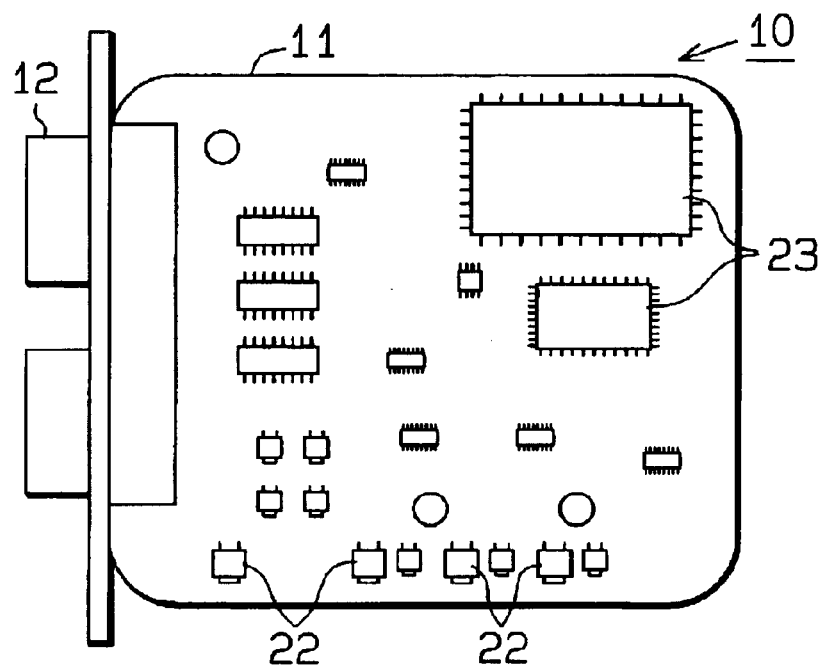
FIG. 5 is a top view of an ECU.

Referring to FIG. 5, various electronic components are mounted on the circuit board 11. The electronic components include heat-producing components 22, which are used for an output circuit, and low heat-resistant components 23, such as a microcomputer and a general purpose IC. The heat-producing components 22 are arranged in an area adjacent to the air blown area 6a, and the low-heat resistant components 23 are arranged away from the air blown area 6a. The heat produced by the heat-producing components 22 is transmitted to the air blown area 6a, and released from there. Since the air blown area 6a is an area that a large amount of the intake air is blown, the heat is effectively released.

The heat radiating efficiency is improved by the fins 21. The temperature on the air blown area 6a is high due to the heat produced by the heat-producing components 22, and the heat is transmitted to the fins 21. The efficiency of the heat radiation is improved as a difference in temperature between intake air and the fins 21 increases. Therefore, the heat is effectively released from the fins 21 when the heat transmitted from the heat-producing components 22 and a temperature of the fins 21 is increased. Furthermore, the fins 21 are arranged along with the stream of the intake air so that the intake airflow is not blocked. As a result, a loss of intake air, that is a pressure loss, can be reduced.

Since the thickness of each fin 21 around its base is large, the heat produced by the ECU 10 is efficiently released. On the other hand, the thickness of each fin 21 around its tip is small. Therefore, the loss of intake air is reduced. As a result, a temperature increase in the ECU is controlled and the heat damage to the electronic components is reduced.

Second Embodiment

Figure 6:
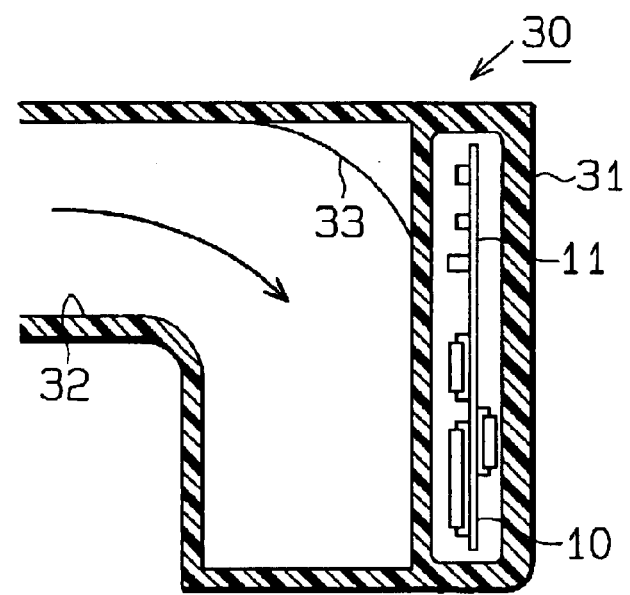
FIG. 6 is a side cross-sectional view of an ECU housing portion according to the second embodiment.

Referring to FIG. 6, an intake module 30 has an ECU housing portion 31. The ECU housing portion 31 has a slot for housing an ECU. The ECU is housed in the slot perpendicular to the top surface of an intake module 30. Intake air is blown to an air blown area located in the upper portion of the ECU housing portion 31. The ECU 10 includes heat-producing components mounted on the upper portion of the circuit board and low heat-resistant components on the lower portion of the circuit board. A number of heat-radiating fins 33 are provided in the air blown area. The structure of the heat-radiating fins 33 is the same as shown in FIG. 4.

Since warm air tends to rise, an influence of heat on the low heat-resistant components can be reduced by placing the components in the lower portion of the circuit board. The heat is released from the air blown area together with the heat produced by the heat-producing components. Therefore, the rise in temperature of the ECU 10 can be reduced.

Modified Embodiments

Figure 7A:
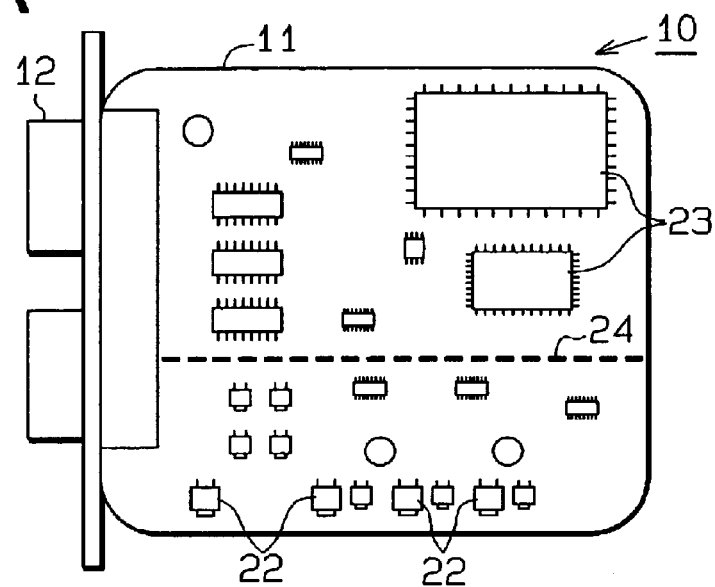
FIG. 7A is a top view of an ECU according to an modified embodiment.

The present invention should not be limited to the embodiment previously discussed and shown in the figures, but may be implemented in various ways without departing from the spirit of the invention. Referring to FIG. 7A, the circuit board 11 includes a conductor pattern (copper foil) 24 provided in a dashed line between an area that includes the heat-producing components 22 and an area that includes the low heat-resistant components 23.

Figure 7B:
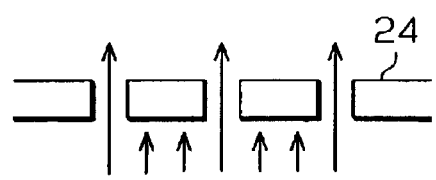
FIG. 7B is an enlarged view of a conductor pattern shown in FIG. 7A.

The heat produced by the heat-producing components 22 is transmitted in the direction indicated with arrows in FIG. 7B. However, the conductor pattern 24 blocks the heat conduction to the low heat-resistant components 23. This improves operating environment of the low heat-resistant components 23.

Figure 8:
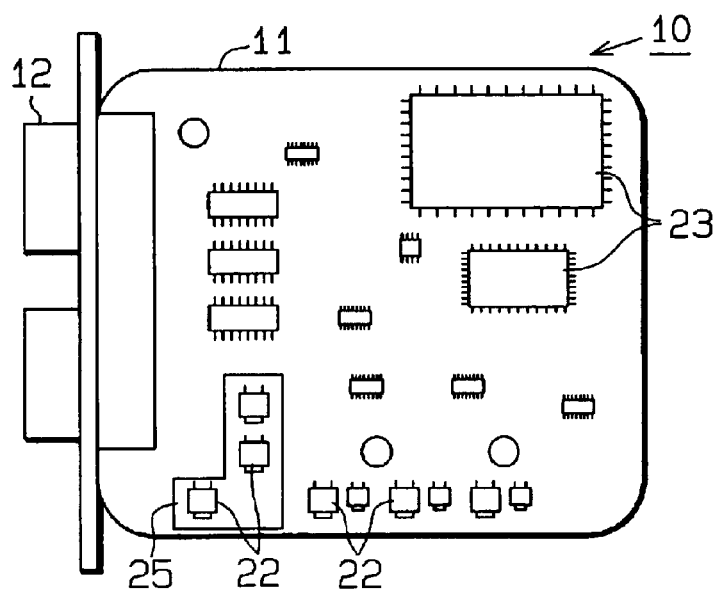
FIG. 8 is a bottom view of the ECU according to a modified embodiment.

Referring to FIG. 8, the circuit board 11 includes a heat-radiating pattern 25 provided on its backside, that is, the side opposite to the side on which the low heat-resistant components 23 are mounted. This reduces temperature increase around the low heat-resistant components 23.

Figure 9:
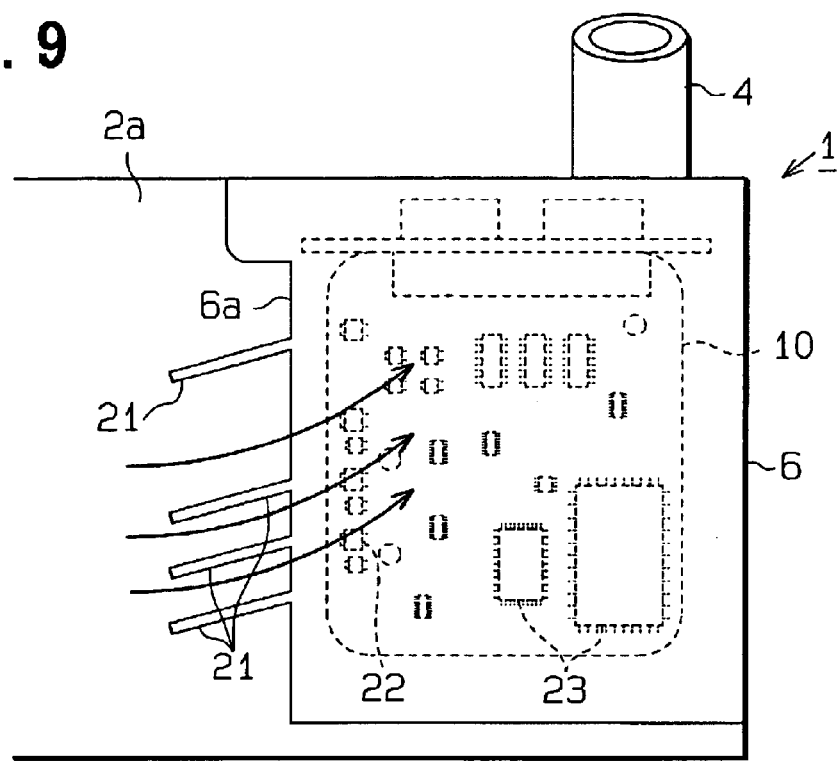
FIG. 9 is a bottom view of inside the ECU housing portion according to an modified embodiment.

Referring to FIG. 9, a number of heat-radiating fins 21 are provided at irregular intervals. The intervals can be determined according to heat-radiating conditions, such as an amount of intake air and an amount of heat produced in the ECU 10. The fins 21 are arranged at large intervals in areas that the airflow speed is high and at small intervals in areas that the airflow speed is low. The fins 21 are also arranged at small intervals in areas that various heat-producing components 22 are mounted.

Sizes of the fins 21 can be individually determined depending on heat radiating conditions, such as intake airflow speed and the number of heat-producing components 22, in the intake air passage 2a. For instance, the fins 21 are small in areas that the airflow speed is high and large in areas that the airflow speed is low. This improves heat-radiating characteristics of the fins 21.

Figure 10:
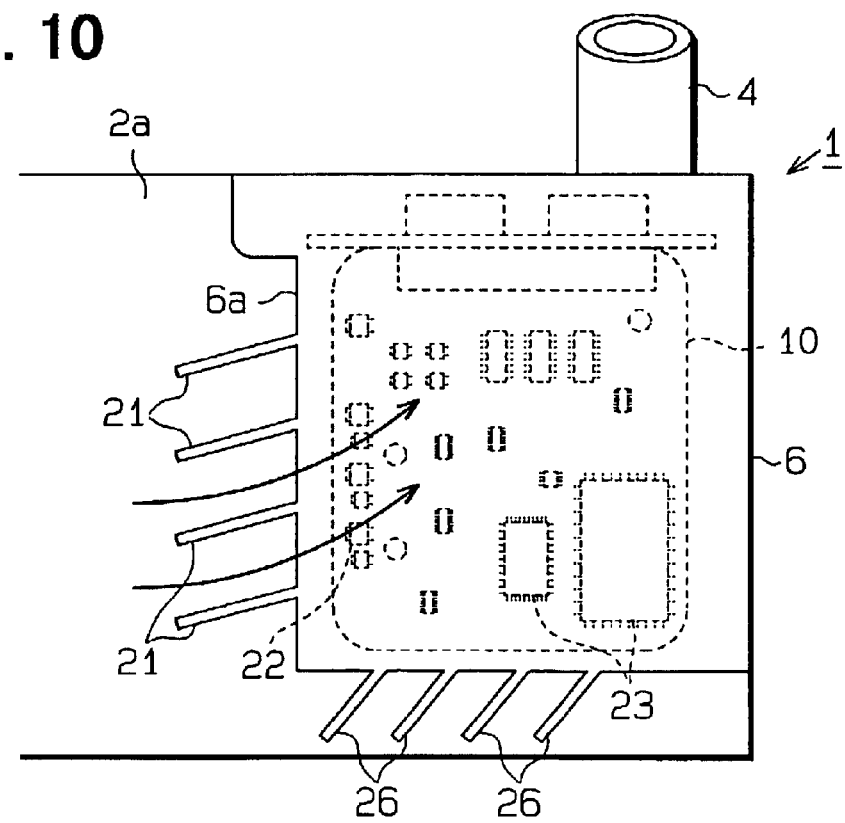
FIG. 10 is a bottom view of inside the ECU housing portion according to a modified embodiment.

Referring to FIG. 10, the heat-radiating fins 26 are provided on a side in addition to the fins 21 on the air blown area 6a. Since the heat-radiating fins 26 are provided in addition to the fins 21, more heat is released. Therefore, the effectiveness of the heat radiation improves.

In the second embodiment, the circuit board 11 shown in FIG. 6 may have the same configuration as shown in FIGS. 7A and 7B.

The ECU housing portion 31 can have configurations illustrated in FIGS. 8, 9, and 10. An air cleaner housing portion 8 and an ECU housing portion 6 of the intake module may be provided separately. In this case, the air cleaner housing portion 8 and the ECU housing portion 6 may be manufactured separately, and fixed together with screws.

What is claimed is:

1. An intake module having an integrally housed electronic control unit, comprising:

a casing that includes an electronic control unit housing portion; and a circuit board that includes heat-producing components and low heat-resistant components, wherein the electronic control unit housing portion has an air blown area to which intake air is blown, and the heat-producing components are located adjacent to the air blown area, and the low heat-resistant components are located away from the air blown area.

2. The intake module according to claim 1, wherein:

the electronic control unit housing portion is provided in a manner that a lateral direction of the electronic control unit housing portion matches a direction of an intake air passage upstream from the electronic control unit housing portion;

the air blown area is located on one side of the electronic control unit housing portion; and the electronic control unit housing portion includes the heat-producing components adjacent to the air blown area.

3. The intake module according to claim 1, wherein:

the circuit board is perpendicular to an intake air passage upstream from the electronic control unit housing portion;

the air blown portion is located in an upper part of the electronic control unit housing portion; and the heat-producing components and the low heat-resistant components are mounted in an upper part and a lower part of the circuit board, respectively.

4. The intake module according to claim 1, further comprising a heat-radiating pattern member on the circuit board to connect the heat-producing components and the air blown area.

5. The intake module according to claim 4, wherein the heat-radiating pattern member is located on a surface of the circuit board opposed to a surface on which the low heat-resistant components are mounted.

6. The intake module according to claim 1, further comprising heat barrier for blocking heat conducting from the heat-producing components to the low heat-resistant components, wherein:

the heat barrier is located between a first area that includes the heat-producing components and a second area that includes the low heat-resistant components; and the heat barrier is in a form of dashed conductive pattern.

7. The intake module according to claim 1, further comprising a heat-radiating fin provided in the air blown area in line with a stream of intake air.

8. The intake module according to claim 7, wherein the heat-radiating fin gradually decreases in thickness toward a tip thereof.

9. The intake module according to claim 7, further comprising a plurality of heat-radiating fins, wherein the heat-radiating fins are arranged at irregular intervals in response to a heat radiation condition in the intake air stream.

10. The intake module according to claim 7, further comprising a plurality of heat-radiating fins, wherein sizes of the heat-radiating fins are determined according to a heat radiation condition in the intake air stream.

11. The intake module according to claim 7, further comprising a heat-radiating fin provided in an area of the electronic control unit housing portion other than the air blown area.

* * * * *